(12) United States Patent
Eastham (10) Patent No.: US 7,109,493 B2
(45) Date of Patent: Sep. 19, 2006

(54) PARTICLE BEAM GENERATOR (76) Inventor: Anthony Derek Eastham, 58 Vincent Drive, Chester, Cheshire (GB) CH4 7RL ( * ) Notice: Subject to any disclaimer, the term of this patent is extended or adjusted under 35 U.S.C. 154(b) by 0 days.

(21) Appl. No.: 10/518,064

(22) PCT Filed: Jun. 16, 2003

(86) PCT No.: PCT/GB03/02560

§ 371 (c)(1),
(2), (4) Date: Dec. 13, 2004

(87) PCT Pub. No.: WO03/107375

PCT Pub. Date: Dec. 24, 2003

(65) Prior Publication Data
US 2005/0199820 A1 Sep. 15, 2005

(30) Foreign Application Priority Data

| Jun. 15, 2002 | (GB) | ................................ 0213772.7 |
| Aug. 24, 2002 | (GB) | ................................ 0219818.2 |
| Jan. 7, 2003 | (GB) | ................................ 0300265.6 |
| Feb. 5, 2003 | (GB) | ................................ 0302591.3 |
| Feb. 14, 2003 | (GB) | ................................ 0303402.2 |

(51) Int. Cl.
*H01J 3/14* (2006.01)

(52) U.S. Cl. .................. 250/396 R; 250/306; 250/307; 250/310; 250/397; 313/251; 313/292

(58) Field of Classification Search ..................... None
See application file for complete search history.

(56) References Cited

U.S. PATENT DOCUMENTS

| 6,023,060 | A | * | 2/2000 | Chang et al. ................ 250/310 |
| 6,281,508 | B1 | * | 8/2001 | Lee et al. ............... 250/396 R |
| 6,369,385 | B1 | | 4/2002 | Muray et al. |
| 2001/0010357 | A1 | | 8/2001 | Ose et al. |
| 2003/0127595 | A1 | | 7/2003 | Nakamura et al. |
| 2004/0169141 | A1 | * | 9/2004 | Adamec et al. ............. 250/310 |

* cited by examiner

Primary Examiner—Jack Berman
Assistant Examiner—Zia R. Hashmi
(74) Attorney, Agent, or Firm—Reising, Ethington, Barnes, Kisselle, P.C.

(57) ABSTRACT

The source of electrons is a nanotip in a vacuum as used in near field microscopy. The source of ions is a similar nanotip in vacuum supplied with liquid metal (gallium) as in a liquid-metal ion source. Electrons or ions from this nanometre-sized tip are extracted by centralising the tip over an aperture plate and applying a suitable voltage to the tip. The electrons (ions) pass through this plate and are accelerated up to several keV using a nanoscale/microscale accelerating column before being focussed using further microscale (or nanoscale) cylindrical lenses. The final element is an aberration corrected miniature (or sub-miniature) einzel lens which can focus the beam at several millimetres from the end of the instrument.

17 Claims, 9 Drawing Sheets

PARTICLE BEAM GENERATOR

The present invention relates to the generation of focussed particle beams (in vacuum) and particularly to electron and ion beams for use in, for example, microscopy, such as, for example, scanning electron microscopy (SEM), and nanotechnology, such as, for example, in nanolithography in the production of nanostructures and nanostructured surfaces by direct write techniques such as ion beam milling (sputtering), for the case of focussed ion beams (FIB), and surface modification methods, such as polymerisation or oxidation, for electron beams.

Known particle beam generators, for use in microscopy and lithography, generally comprise a particle source, operable to provide illumination. This is usually a sharp tip from which particles, such as electrons or ions, are extracted by application of a relatively strong electric field, that is, a field emission source. Alternatively, a heated filament (tungsten hairpin) may be used as a source. However, a field emission source is advantageously used in applications where relatively high spatial resolution imaging is desirable. The source usually also comprises a voltage driven particle accelerator to increase the particle beam energy to a desired level. A focusing system, which may comprise, for example, magnetic lenses, is controlled to focus the accelerated particles at a cross over point to form a beam spot on a surface of a material. In the case of microscopy the material would be the sample under investigation.

For microscopy, such as for the SEM, a set of coils are used to facilitate scanning of the beam over the sample. The sample is mounted on a stage disposed below the field of an objective lens. The specification and properties of the objective lens and the distance between the objective lens and the sample, that is, the working distance, dictate the resolution limitations of the microscope. A detection system, operable to detect secondary and backscattered electrons, is usually disposed below the objective lens. Known near field microscopy instruments are disadvantaged in that the position of the detection system dictates the working distance of the microscope and therefore prevents short working distances being advantageously utilised, thereby limiting the optimum resolution achievable by the microscope.

The size of the final beam spot and the amount of beam current in this focussed spot determine the performance of these instruments. For microscopy the beam spot size is the effective spatial resolution of the instrument and for nano-lithography it determines the minimum size feature which can be made. The current state of the art for commercial particle beam generators is 1 nm for electrons and 30 nm for metallic ion beams.

It is desirable in microscopy and lithography for there to be a particle beam generator operable to provide a beam having a greater optimum resolution than is currently available. More particularly, it is desirable for there to be a particle beam generator suitable for use in nanoscale analysis of samples in microscopy and in nanolithography. Such resolution would provide atomic identification at a significant depth of field and provide surface analysis at nano-scale dimensions.

Furthermore, the relatively long working distance, as required in known instruments, is also a disadvantage in that it necessitates application of a relatively high particle acceleration voltage to achieve optimum resolution at that distance. However, a higher particle acceleration voltage increases the energy of the particle beam, which, at an upper threshold, may cause undesirable increases in inelastic scattering within the material structure thereby causing radiation damage to the material being examined. In microscopy, a relatively low energy beam having a relatively high resolution provides the possibility of reduced inelastic scattering of the material electrons, relative to known apparatus, to such an extent to enable complex molecule structures to be analysed.

Therefore, it is desirable in microscopy and lithography for there to be a particle beam generator operable to provide a beam comprising particles accelerated using a lower voltage than is currently available.

Although, the SEM is specifically mentioned above as an example of microscopy, the reader will appreciate that other so-called near-field microscopy instruments exist such as, for example, the Scanning Tunnelling Microscope (STM) and Atomic Force Microscope (AFM).

It is therefore desirable for there to be a particle beam generator operable to provide a beam, suitable for use in nano-scale dimension applications, comprising particles accelerated using a relatively low voltage, which is suitable for use with known near-field microscope instruments.

Furthermore, such near-field microscope and lithography instruments are expensive and it is desirable to increase resolution and depth of field and/or decrease the accelerating voltage without having to replace the whole of the instrument.

Known microscopy and lithography instruments are also disadvantaged because they are vulnerable to vibration which can effect the operation thereof and therefore it is desirable for there to be microscopy and lithography instruments which are less susceptible to vibration.

The present invention provides a particle beam generator, suitable for use in nanometre technologies, comprising an extractor plate, having an extractor aperture, disposed adjacent a particle source and operable to extract particles from such a source into the extractor aperture to form a particle beam, particle accelerating means operable to accelerate the extracted particles to increase the energy of the beam, and collimating means operable to collimate the particle beam, characterised in that at least one of the extractor aperture and the accelerating means inhibits lateral expansion of the particle beam to provide a near parallel particle beam having a diameter less than 100 nm.

The particle beam generator may further comprise focussing means operable to provide, from the laterally inhibited particle beam, a focussed particle beam having a diameter less than 1 nm.

The present invention utilises scale invariance of particle trajectories in electric fields. The absolute size of the beam spot may be related to the overall size (in particular the focal length of focussing lenses) of the active elements of the instrument. These elements (in order from source to final beam spot) are a particle source and accelerating means, which may act, individually or in combination, to inhibit lateral expansion of the particle beam. Such particle beam generators may be sub-miniature and contain micro-machined focussing and accelerating means which inhibit expansion of the beam. Therefore the resolution may be kept much smaller than in larger instruments. Thus a design made at the scale of 100 mm may have beam spot sizes at least substantially 100 times larger than a micro-machine with maximum sizes of millimetres. Although a larger instrument will allow use of higher voltages and thus accelerate the beam to higher energies which may result in smaller beam spot sizes, even when this is taken into account, the beam spot size of sub-miniature designs may be at least substantially 10 times smaller than a substantially identical larger instrument.

The diameter of the extractor aperture may substantially be between 5 nm and 500 nm. More preferably, the diameter of the extractor aperture may substantially be between 5 nm and 100 nm.

The particle accelerating means may comprise a plurality of accelerator plates arranged in a stack and electrically isolated from each other. Each of the accelerator plates may comprise an aperture adapted to share a common longitudinal axis with the extractor aperture to thereby form an extended accelerating aperture. On application of a voltage between the extractor plate and a first acceleration plate and between each pair of successive adjacent acceleration plates arranged in the column thereafter, extracted particles may be accelerated through the accelerating aperture and thereby increase the energy of the beam of which they are constituent parts.

Alternatively, the extractor plate may be a first conductor which is separated form a second conductor by at least one of a resistive and insulator material and the accelerating means may comprise an accelerating aperture which extends from the extractor aperture through the material and through the second conductor, wherein extracted particles are accelerated through the acceleration aperture on application of a differential voltage between the first and second conductors. Preferably, the resistance of the material is substantially between 1 kΩ and infinity. The material is preferably a semiconductor material and advantageously doped Silicon.

Advantageously the diameter of the accelerating aperture is substantially between 10 nm and 1000 μm. The collimating means may be integrally formed with the accelerating aperture and advantageously comprises a conical formed in the wall thereof. The conical shape being such that the diameter thereof increases in the direction of the accelerated beam.

Alternatively, or additionally, the collimating means may comprise at least one collimating aperture having a lesser diameter relative to the accelerating aperture and may be disposed on the longitudinal axis thereof.

The particle beam generator advantageously comprises a particle source integrated therewith, which is preferably a field emission source.

The particle beam generator may be adapted for use with an electron particle source or, alternatively, may be adapted for use with an ion particle source.

The particle beam generator may form part of a near field microscope and may be mounted on a microchip.

The present invention will now be described, by way of example, with reference to the accompanying drawings, in which.

Figure 1:
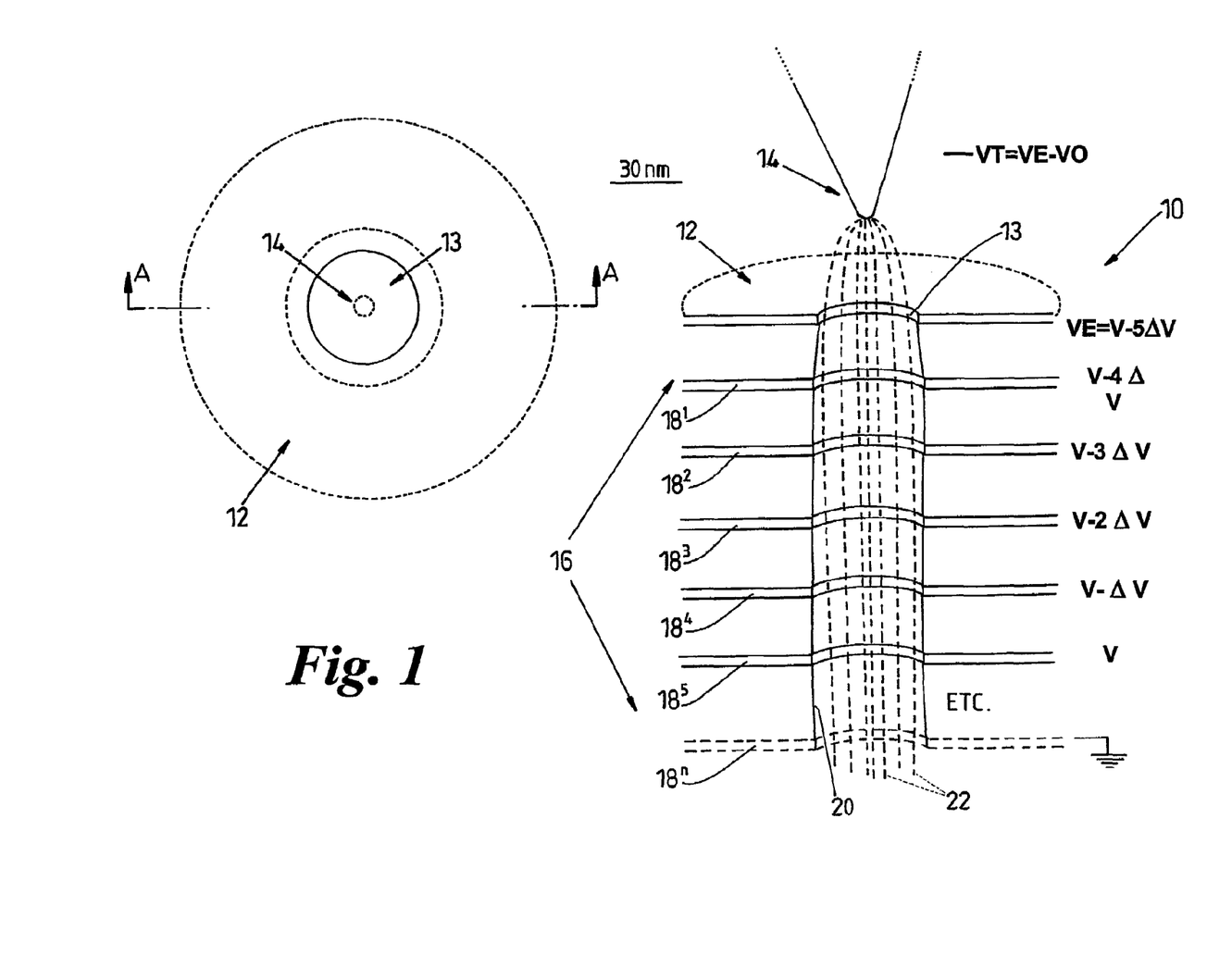
FIG. 1 is a schematic diagram, through section A—A, of a particle beam generator according to a first embodiment of the present invention.

Referring to FIG. 1, a particle beam generator 10 comprises an extractor plate 12, having an extractor aperture 13, positioned using a piezo-electric control system (not shown) so that it is located centrally with respect to a particle source 14. The particle source is a near field nanotip source. The nanotip is a standard SEM tip with a radius of around 8 nm. The dotted circular line indicates that the extractor plate can be laterally much larger than indicated. The accelerator column 16 consists of a series of acceleration plates 18 stacked to form a column, each plate having an aperture adapted such that when the plates are stacked they share a common longitudinal axis with each other and with the extractor aperture 13, to form an extended acceleration aperture 20. Each plate 18 is electrically isolated from each other and can be supplied with its own voltage. The voltages on the plates 18 and the nanotip 14 are shown on the right hand side for the case of accelerating electrons or negative ions. For this case V is always negative and the final energy of the electrons from the column is VT in electron volts (eV). ΔV is the voltage difference between each plate in the column and VO is the difference in voltage between the tip and the extractor plate. (The largest negative voltage is on the tip and the voltages increase moving down the column to the final plate at zero voltage.) The particle beam generator 10 may be adapted for use with near field microscope apparatus and may be designed for operation in the energy range from 300–1000 eV. The voltages and separations of the electrodes are adjusted so that the nanotip emits electrons and the field in the accelerating aperture is that required to produce a slightly converging beam. Electron trajectories are schematically indicated by the dot/dashed lines 22 with the electrons travelling from the top to the bottom of the diagram. These trajectories indicate the overall beam profile which is defined by the envelope which contains the majority of the electrons which are emitted from the tip and pass through the accelerator column.

Figure 2:
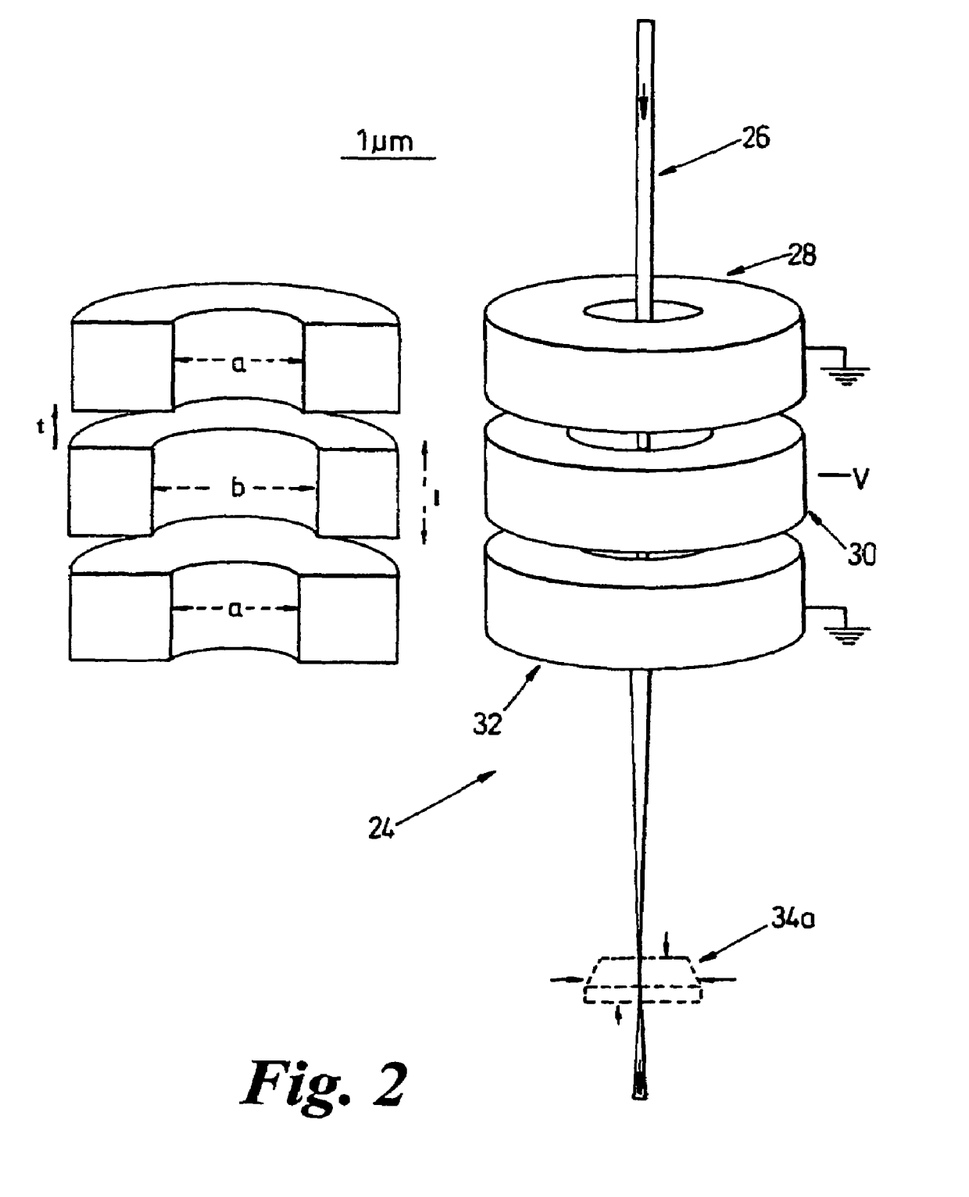
FIG. 2 is a schematic diagram of an example of first stage focussing means suitable for use with the particle beam generator of FIG. 1.

Referring to FIG. 2, first stage focussing means 24 are shown comprising a first micro-scale lens system. This micro-scale lens system is disposed to collect and focus the particle beam from the accelerator aperture 20. FIG. 2 shows the focussing effect on the beam profile 26. This lens is an aberration corrected cylindrical einzel lens consisting of three cylindrical elements 28, 30 and 32. The outer two elements 28 and 32 are at earth potential and the central element is supplied with a voltage sufficient to focus the electrons at the required position. (Either polarity voltage can be applied but the aberrations are the smallest for a positive voltage, when used to focus electrons, and a negative voltage when used to focus positively charged ions.) An approximate scale of this particular micro-lens is shown at the top of the figure. As an example, in the diagram the beam is focused at a sample holder 34a which can be moved laterally to scan the sample and along the beam axis to adjust the focus. The aberrations in this lens are corrected by adjusting the relative dimensions marked a, b, l and t on the sections of FIGS. 1 and 2.

Figure 3:
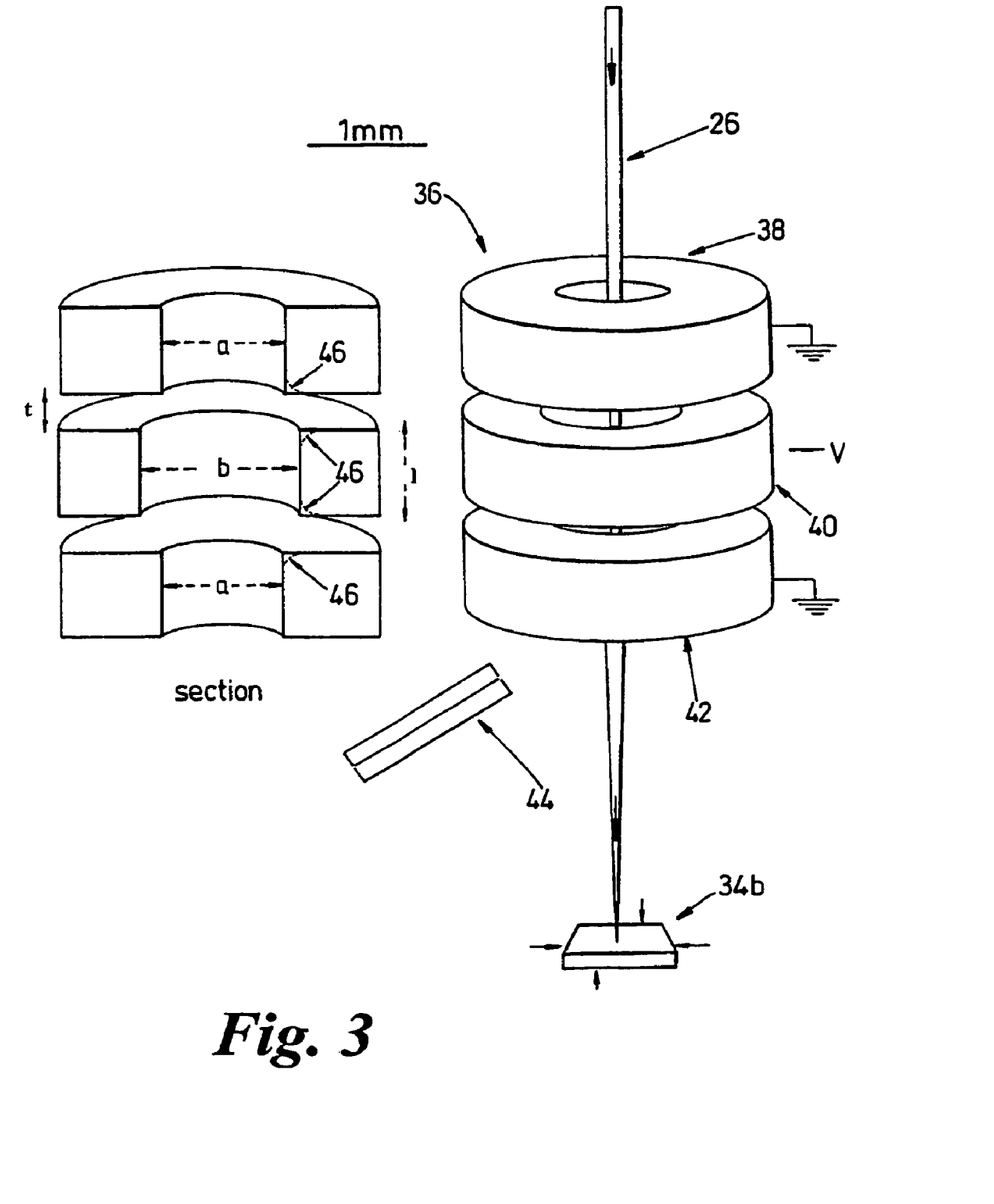
FIG. 3 is a schematic diagram of an example of second stage focussing means suitable for use with the particle beam generator of FIG. 1 and the first stage focussing means of FIG. 2.

Referring to FIG. 3, a second stage focussing means 36 are shown, comprising a miniature einzel lens consisting of three cylindrical elements 38, 40 and 42. It is essentially the same as the previous lens except that it is approximately a thousand times larger and focuses the beam 26 at a point several millimetres from the end of the instrument where a sample holder 34b is positioned. As previously the scanning is achieved by moving the sample laterally using a piezo-electric control system. Also the holder 34b can be moved along the axis to place the sample at the exact focus. Because the focal length is millimetres it is now possible to include an electron detector 44 in the space above the target. This is used to detect and measure the back-scattered electrons so that scanning images can be obtained. It is most important that this lens is corrected as well as possible for aberrations. In addition to relative adjustments of the dimension a, b, l and t, the curvature of the inner surface 46 shown by a dot/dash line can be also optimally shaped.

In use, the extractor plate is disposed in close proximity to a particle source and a voltage is applied between the plate and the source causing electrons to be emitted directly from the tip by the process of field emission. A similar process can produce an ion beam if liquid metal is supplied to the tip as in focussed ion beam sources. The brightness of these electron/ion beams is extremely large and they can be therefore focussed to small spots. To use this beam and inhibit it from laterally expanding an extractor plate having a nanoscale extractor aperture is used, followed by a high electric field region on the side of the plate opposite to the nanotip. Thus the electrons/ions can be successfully extracted from the nanotip source and pass through the extractor aperture, which can be centred on the nanotip source by moving the extractor plate using piezo-electric translation devices as commonly employed in near field spectroscopy. The electric field on the opposite side of the extractor plate is made to be similar to that on the side facing the nanotip source accelerating the electron/ions and at the same time producing a weak focussing effect. The particle beam size following this aperture is essentially determined by the aperture size and calculations show that most of the electrons or ions emitted from a nanotip source can be formed into this particle beam if the aperture is around 30 nm in size.

This design of source is different to that conventional employed in that it uses a nanoscale aperture positioned close to the tip preferably less than a few hundred nanometres away. Thus electrons can be extracted through a minute aperture and can therefore be subsequently confined to small dimensions close to the axis of the following lenses. Also it means that much smaller voltages are needed to generate field emission from the tip. By using a nanoscale/micro-scale accelerating column having an accelerating aperture extending from the extractor aperture it is possible to generate an approximately equal electric field on either side of the extractor plate so that it is possible for the extractor plate to act as a weak lens. This is in addition to its (the accelerating aperture) function of accelerating the electrons/ions. Thus the beam is not allowed to expand significantly in its progress through the instrument which, because of the small size of the beam, limits the unwanted effects of lens aberrations, and allows the use of cylindrical focussing lenses (both electrostatic and magnetic) with apertures in the range from 1–1000 μm which considerably benefit from the overall decrease in scale of the instrument.

This allows the use of focussing lenses with micro-scale (sub-miniature) and millimetre focal lengths. Since these focal lengths are considerably smaller than conventional electron microscopes it is possible to focus the beam down to much smaller dimensions with fewer corrections for lens aberrations.

These miniature and sub-miniature designs are for operation as stand alone instruments for electron/ion energies up to a maximum of a few keV but they may also be employed as the first stages of a larger conventional high energy electron/ion beam system working up to and beyond 100 keV.

The beam from the source accelerator column then passes through a micro-scale cylindrical einzel lens positioned at a distance such that the beam from the end of the accelerator column has not expanded significantly before it reaches this lens. It is then possible to focus the beam, using this lens, down to diameters below one nanometre at several microns distance from the final lens element. In order to get the smallest focal spot this element is corrected for aberrations by adjusting its geometry as described later.

Although it is possible to use this focussed beam spot directly for SEM or FIB techniques it is more practical if the beam is then passed through a miniature, or sub-miniature, einzel lens with typical aperture diameters from a few hundred to several thousand microns. This lens is positioned at an optimal distance from the first micro lens such that it is possible to obtain the smallest beam spot at distances of millimetres from the end of the last lens element of the lens. Such an arrangement is much more practical and allows for the insertion of electron detectors normally needed for SEM.

Although the beam size through this last lens can be less than a few microns it is still necessary to correct for aberrations (mainly spherical) to achieve the best performance. This is done by altering its geometry as detailed later. Focussed beam spot sizes significantly smaller than 1 nm can be obtained if this lens is properly corrected.

It will be appreciated by a person skilled in the art that other first and second stage focussing means may be utilised which may be equally applicable to the working of the invention.

Figure 4:
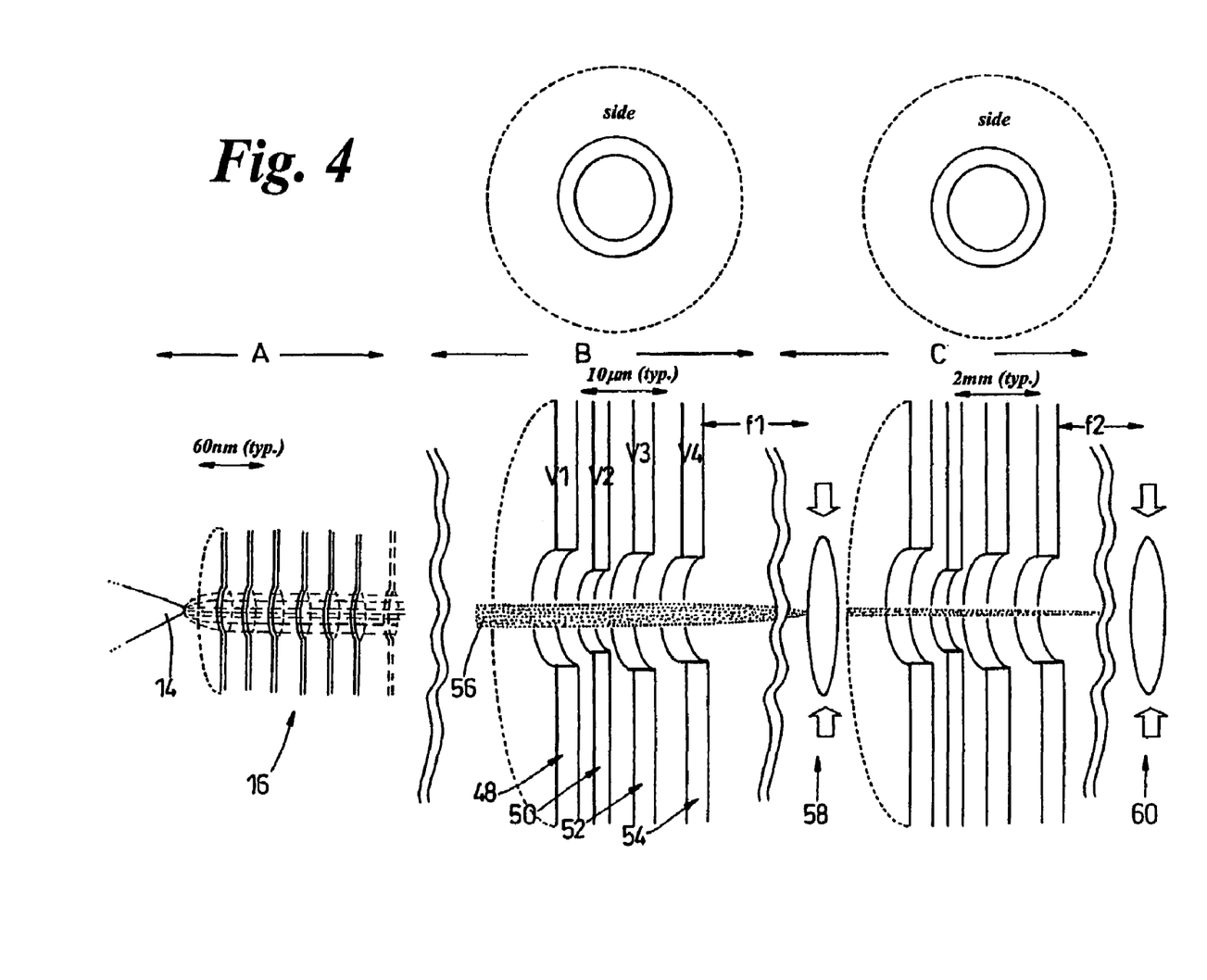
FIG. 4 is a schematic diagram of the particle beam generator of FIG. 1 and the first and second stage focussing means of FIGS. 2 and 3, respectively.

Referring to FIG. 4, a complete system is shown comprising two four-element, cylindrical, einzel lenses, one microscale, labelled, B, and one miniature, labelled, C. These lenses are situated downstream of the electron/ion source labelled, A. By having many variables in the geometry they can be made to have very low aberrations. This is somewhat analogous to multi-element optical lenses in cameras and optical instruments. The final design for these beam elements depends on the electron/beam energy, divergence and size as it enters the lens. The parameters which can be varied are:

1) The number of elements
2) The thickness of each electrode
3) The spacing between the electrodes
4) The aperture sizes in each electrode
5) The shape of the edges on the lenses as shown in the previous application
6) The voltages applied to each electrode We have been able, by suitable variations in these parameters to almost completely eliminate spherical aberration from our system.

FIG. 4 shows the geometry of a four-element lens with electrodes labelled 48, 50, 52 and 54 with voltages V1, V2, V3 and V4 respectively. The beam and its direction are labelled 56. A first analysis position, 58, is a focus distance, f1 from the end of the microscale lens. Scanning of the beam is achieved by moving the sample using piezos as is usual in scanning tunnelling microscopy. This sample position can be removed and the beam made to travel through the second miniature lens so as to come to a focus at a distance, f2, from the end of the second lens. At this point there is a piezo driven sample holder, 60. Although this second miniature lens is shown as having the same geometry as the first lens this need not necessarily be the case. Again the exact geometry (aperture sizes etc) will depend on the beam properties as it passes through this lens. Typical aperture sizes are around 5 μm for the microscale lens and 5 nm for the miniature lens but these can be varied over a wide range.

Figure 5A:
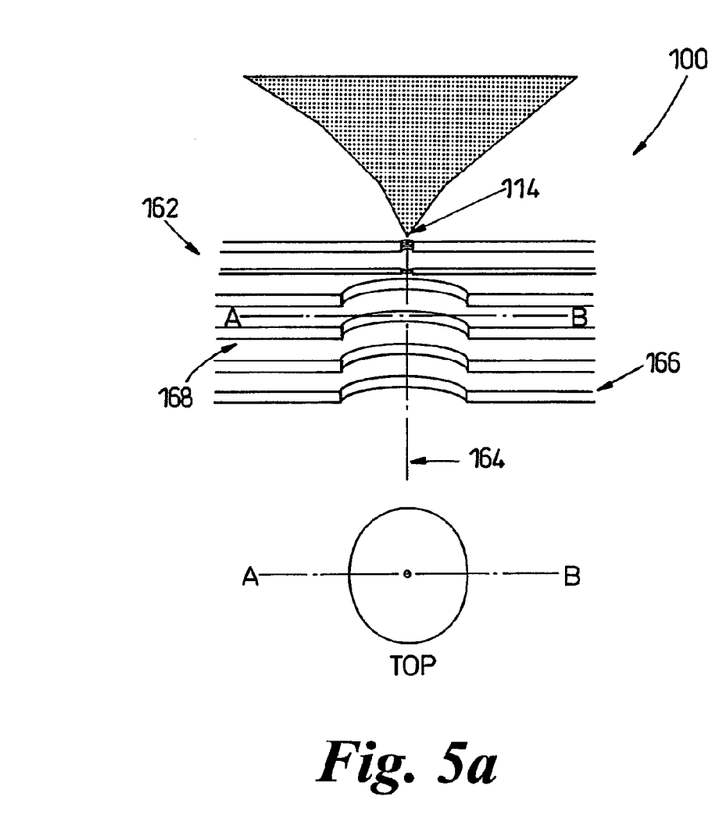
FIG. 5 is a schematic diagram of the particle beam generator according to a second embodiment of the present invention.
Figure 5B:
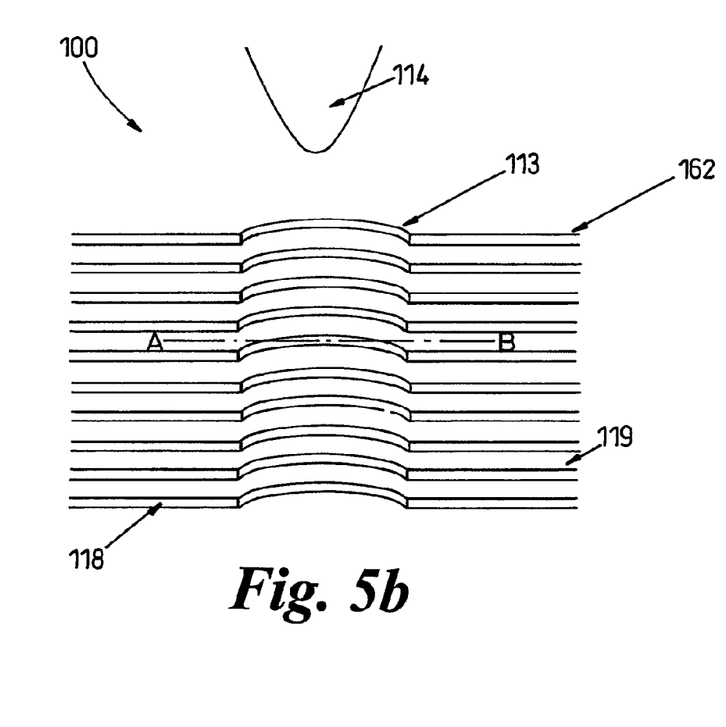

A further embodiment of the present invention is shown in FIG. 5, wherein a particle beam generator is a micro-chip 100 comprising one or more nanocolumns 162 which produce a narrow (<50nm) on-axis beam. A nanotip 114 is at the end of a microstructure which is attached to the vertical cantilever (not shown) and positioned centrally and greater than 10 nm from the first aperture 113 of the nanocolumn 162. The nanocolumn 162 can be in one or more parts as shown and defines an axial beam of lateral dimensions less than 50 nm. A typical nanocolumn 162 is shown in figure 5b and is made of a thin multi-layer film consisting of alternate metal (conducting) layers, 118, interspaced with insulating layers 119 through which a circular aperture 113 is made by lithography or using a focussed ion beam (FIB) 'milling machine'. The total length of the nanocolumn(s) may be up to 2μm and is sufficient to accurately determine the (on-axis) direction and phase space emmitance of the beam. The nanotip 114 is positioned above the aperture as shown and a voltage diferrential is applied between the tip 114 and the nanocolumn electrodes 162. The beam defined by the nanocolumn has an axis 164 which is concentric with the multi-element, microscale, einzel lens. This lens consists of metal (conducting) electrodes 166 interspaced with insulators 168. The assembly shown consists of four metal electrodes interspaced with insulators and is positioned at distances of only a few microns from the nanocolumn from which it is separated by an insulating film with an aperture of the same dimension as the microlens. Suitable aperture diameters for this lens are given in the previous application. Increasing the number of metal conducting electrodes in the stack can reduce aberrations in this lens.

Figure 6A:
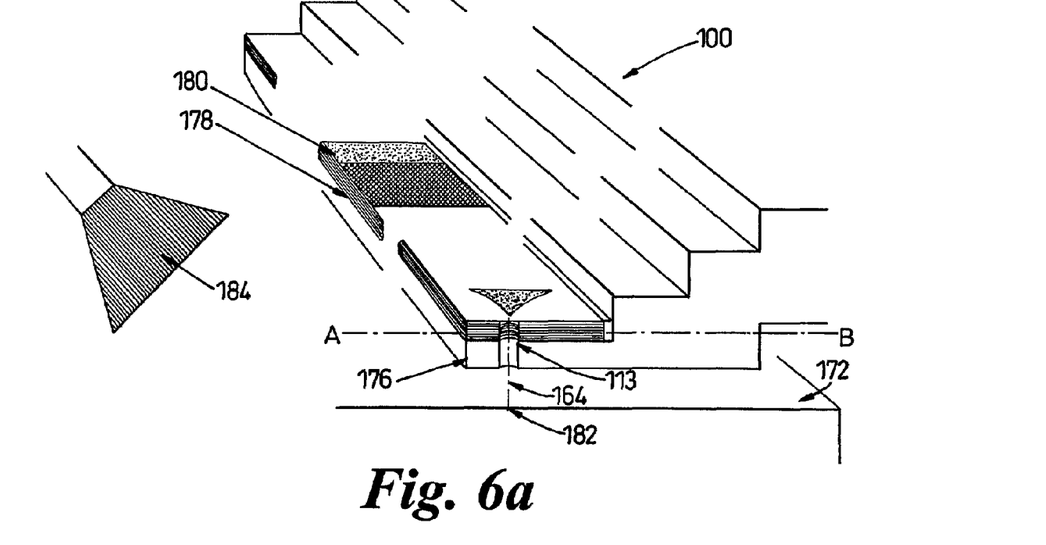
FIG. 6 is a schematic diagram of a particle beam generator according to a third embodiment of the present invention.
Figure 6B:
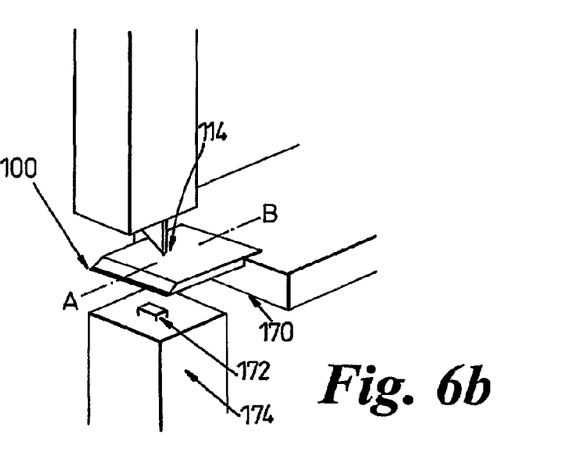

FIG. 6 shows one of the ways of constructing the microscope so that it is possible for the microlens to focus the beam at a point less than 50 μm from the end of the instrument. This condition is necessary if the beam is to have a lateral size less than 1nm and approaching 1 Å. (This beam spot essentially determines the resolution of the instrument.) An application of this embodiment of the present invention is shown in near field microscopy in FIG. 6b and consists of the 'chip' or body 100 rigidly attached to a horizontal cantilever arm 170, of a near field microscope, which can be positioned using standard techniques of nanopositioning. A vertical cantilever above this holds the nanotip 114 and this can be moved vertically and scanned in the horizontal plane. The sample is mounted on a special retainer 172 which has a small surface area for attaching the sample. (This atomic resolution arrangement can only accommodate small area sample; for larger areas the focal length of the microlens is increased and the resolution degrade to around 1nm.) A further vertical cantilever 174 below the microscope body holds the sample retainer and provides a means of positioning the sample at the correct vertical distance as well as scanning in the horizontal plane.

The details of the body or chip 100 are shown in FIG. 6a A series of steps are produced by lithography, or micromachined with laser beams, in one edge of the chip. The bottom step is only a few μms thick and wider than about 20 μm. On this step 176 are formed a multi-layer assembly 178 which is essentially the body of the particle beam generator as shown in FIG. 6a. The multi-layer is grown by atomic deposition in two stages. First the layers corresponding to the electrostatic lens are produced and a hole 113 corresponding to the lens aperture is fabricated in the layers by lithography near to the edge of the step corresponding to the letter A in the diagram. (Many holes can be produced in one lithographic procedure and each can be a separate microscope.) The top layer is covered with a nanometre thick film of gold or carbon and the successive multi-layer are then grown (by atomic deposition) corresponding to the layer of the nanocolumn. The layers are produce using a horizontal mask which allows each separate layer to terminate at a different position along the step. This provides an essential method of attaching electrical contacts to the electrodes in the microscope as illustrated by the exposed area 180. Finally the nanocolumn hole is drilled through the top multi-layer on axis with the electrostatic lens using a focussed ion beam. (This can also be made by state of the art e-beam lithography and dry etching techniques.)

In operation the nanotip 114 is centred on the aperture and the voltages on the lens adjusted to focus the beam, with axis 164 onto the sample at focal point 182. The thickness of the support step 176 and the focal length are arranged so that there is a sufficiently large enough gap for the backscattered electrons to be recorded with the channeltron, 184.

Two further adaptations are possible to allow the microscope to be contained in a single chip. Firstly the nanotip and a microscopic cantilever can be produced in the body of the chip. (This would probably be a horizontal cantilever.) Secondly the detector can be fabricated into the base of the chip. For this purpose it is probably better to use a semiconducting avalanche type detector for the electrons. It is even possible to consider incorporating the mechanisms to scan the sample within the base of the chip to make the ultimate SEM on a chip.

In use, typical dimensions and voltages are as mentioned above for the previous embodiment of the present invention. A suitable arrangement is for the nanotip 114 to be positioned using a vertical cantilever arrangement as used in scanning tunnelling microscopy (STM). However recent advances in lithography make it possible to incorporate this cantilever into the microscope itself. The nanocolumn consists of a multilayer of conducting (metal or silicon) thin films separated by insulating layers through which a circular hole of the required nanoscale size (typically less than 50 nm) is fabricated. This is made either by lithographic techniques or by drilling using a focussed ion beam. A microscale multi-element einzel lens is positioned below the nanocolumn and concentric with it. This can be made as a separate part and can be independently positioned with respect to the nanocolumn using standard micropositioning sytems. In a simpler form the microlens is made into the same multilayer structure as the nanocolumn and the whole forms the basic element of the microscope. Fabrication of the lens can be made by a variety of techniques including lithography and laser beam machining.

The microscope body is held on a vertical (cantlilever) arm which can be positioned both vertically and laterally. The nanoprobe is centred on the nanocolumn aperture by a servo-mechanism which uses the current in a quadrant metal thin film which forms the first electrode in the nanocolumn. Below the microscope body is a sample stage on the end of a vertical cantilever. The electron beam is focussed onto the sample and can be moved across the sample by moving the end of the cantilever using standard nanopositioning techniques as used in STM, for example using piezo-electric mechanisms. If the backscattered electrons are detected using an electron detector (chaneltron) then an image of the atomic structure of the surface can be made. In the ultimate design the electron detector can be incorporated into the base of the microscope chip.

The design for a focussed ion beam system suitable for machining surface structures below 10 nm can be adapted from the previous description by feeding liquid gallium to the nanotip and reversing the polarity of the voltages. In this arrangement the geometry is inverted so that the nanotip is positioned below the nanocolumn. (This is to prevent liquid gallium from contaminating the microscope.)

Figure 7A:
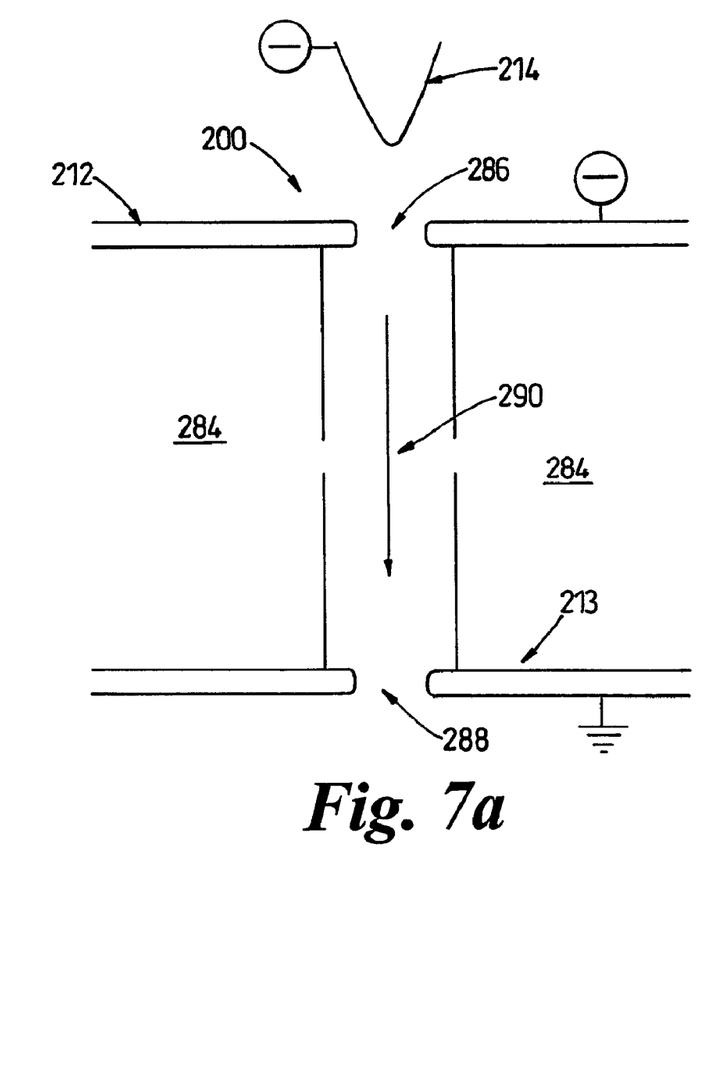
FIG. 7 is a schematic diagram, in section, of a particle beam generator according to a fourth embodiment of the present invention, also showing collimating means.
Figure 7B:
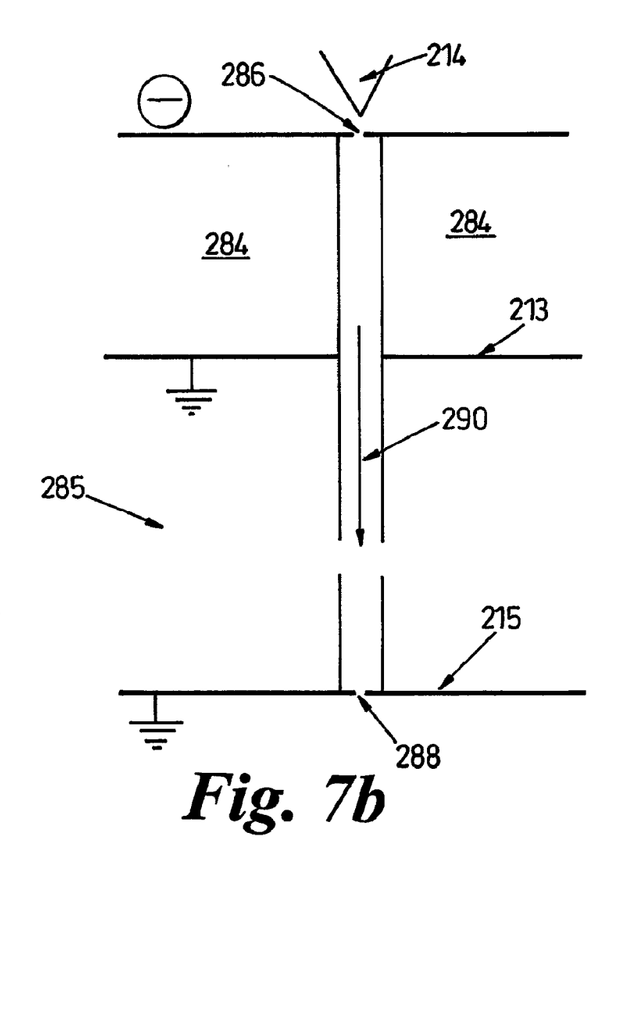
Figure 8:
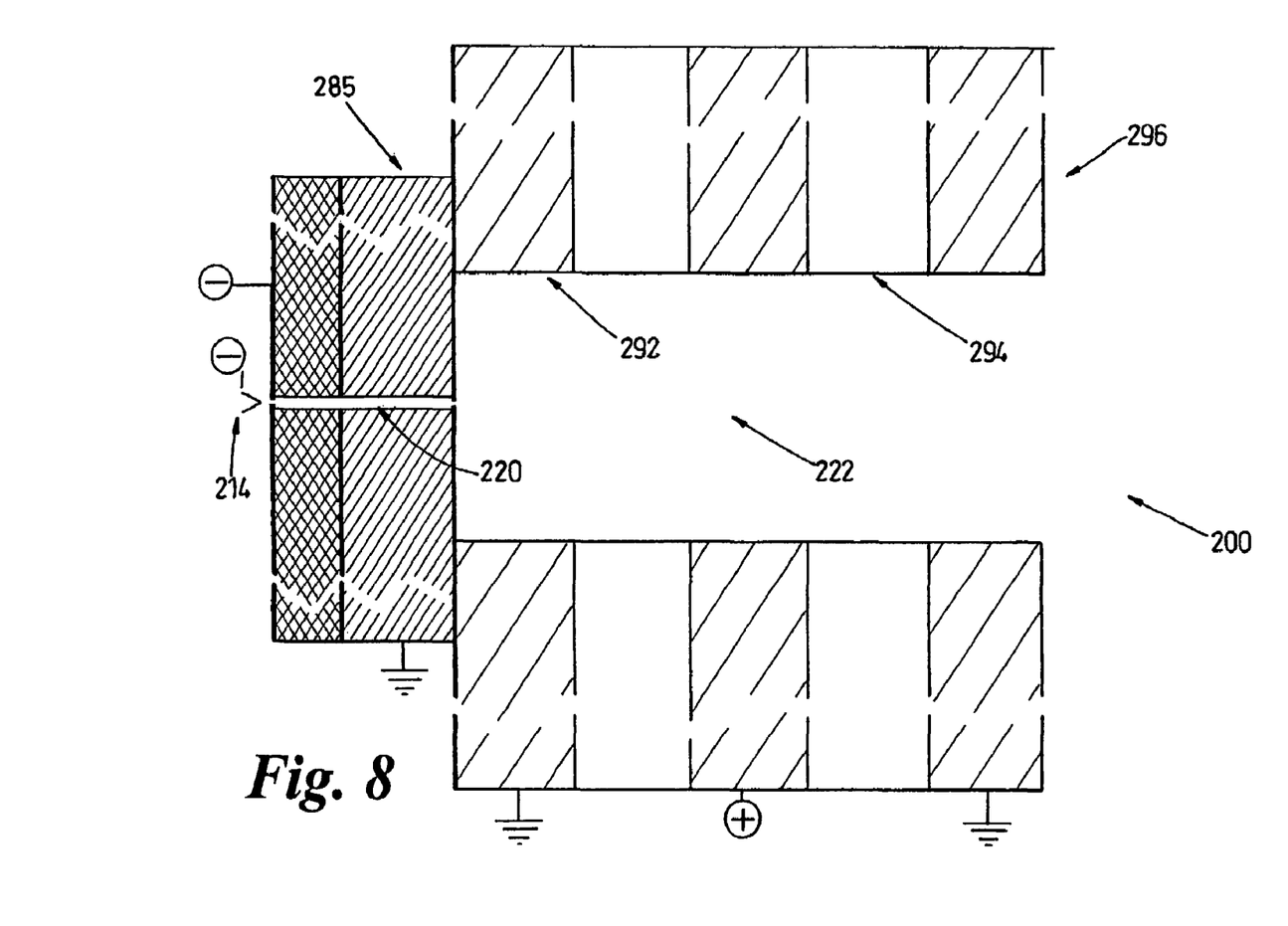
FIG. 8 is a schematic diagram, in section, of a microscope element comprising a particle beam generator according to the present invention; and, FIG. 9 is a schematic diagram of further collimating means.

A further embodiment of the present invention is shown in FIGS. 7 and 8, wherein a particle beam generator 200 comprises a pair of thin film metallic layers, 212 and 213 separated by a semiconductor material 284. Each of the metallic layers comprises collimating apertures 286 and 288 (nanocollimators). The beam generator 200 also comprises an accelerating aperture 220 which extends through the semiconductor material and shares a longitudinal axis with the collimating apertures 286 and 288. The diameter of the accelerating aperture 220 is greater than the diameter of each of the collimating apertures 286 and 288. Typically, the diameter of the accelerating aperture might be around 50nm and the nanocollimator apertures of about 30nm. Particles will be emitted from the nanotip 214 if a sufficient voltage difference exists between the tip and the collimating aperture 286. These particles will be accelerated and focused into an almost parallel beam if the voltage difference across the semiconductor is sufficiently large enough. (The arrow 290 shows the electron beam direction in both FIGS. 7a and 7b). Typically for an 0.5µm silicon thin waver, or film, the voltage across the semiconductor might be around 300 volts and this will generate a uniform field along the hole of 600MV/m. A longer nanocolumn is possible if it is made in two stages as shown in FIG. 7b. Here there are two layers separated by a conducting film 213. The bottom layer 215 is conducting and can be made from metal or preferably very low resistivity doped silicon. If the two metal films 213 and 215, are at earth potential then the whole bottom column 285 is at earth potential. The nanoaperture 286 performs the same function as in the device shown in FIG. 7a but the aperture 288 which can be several microns from the nanotip is able to reduce scattering whilst further lowering the (phase space) emittance of the electron beam. The hole in this lower column 285 is fabricated at the same time as that of the upper accelerating section. Its sole function is to support the nanoaperture 288 concentric with the hole in the semiconductor. A narrow electron beam, which is limited in diameter to the aperture size 288 then passes to the electrostatic focussing elements of the microscope as shown in FIG. 8.

A complete particle beam generator system for use as a microscope is shown in FIG. 8 with the accelerating aperture 220 and the nanotip 214 being the source of electrons. The narrow beam of electrons 222 passes from the nanocolumn 286/288 and through a concentric einzel lens as shown. This lens is a simple three-element arrangement which is manufactured from conducting and insulating layers, 292 and 294, respectfully through which an aperture is manufactured. Multiple element lenses, containing five or more electrodes, are also possible to reduce aberrations as previously mentioned for other embodiments. The inside diameter (aperture of the lens) and spacing of the electrodes is chosen to give minimum aberrations and hence the smallest beam spot. Typical dimensions for the lens are about 2µm for the inside diameter and each layer being about 1µm thick. Manufacture of the einzel lens is simplified if it is made from a single thin waver of three distinct layers. Using silicon at different doping concentrations can produce a conducting layer 292 and an insulating layer 294. For a simple 3 element lens the outer two conducting electrodes are at earth potential and the central one is at the correct voltage to give a focus at the desired distance from the end of the assembly 296. This whole assembly forms the body of the microscope and when this is fabricated at the edge of a stepped assembly as previously mentioned in another embodiment the beam generator is essentially a single chip apart from the nanotip. However this nanotip is at the end of a cantilever so that it can be positioned on the centre of the nanocolumn entrance aperture and can thus be integrated into the nanochip to make a complete focussed electron (ion) beam machine, namely a 'Microscope on a Chip'. Note that the resistive film from which the microscope body is made can have many holes in it so that they can all be accessed by moving the nanoprobe to any entrance aperture.

In the previous embodiment an accelerating nanocolumn is constructed from a multilayer structure of alternate metal (conducting) and insulating layers through which is a hole of diameter of less then 100 nm is fabricated and is the channel down which the electrons pass. By applying voltages to the conducting electrodes in this assembly it is possible to produce a high electric field along the evacuated aperture in the column. This embodiment is a simpler method of producing nanocolumns or accelerators which have the same effect as the previous assembly. Furthermore this new device is simpler to manufacture and can accommodate the inclusion of restricting (anti-scatter) collimators at both ends of the column. The method is to manufacture the accelerator from a single sheet of high resistivity material through which holes are produced using microfabrication techniques. The favoured material, though not the only possibility is single crystal doped silicon as used for the manufacture of microchips. The doping will normally be n-type (though p-type is possible) and the doping density should be such that the resistivity is in the range from 1 kΩm-cm to 100 MΩm-cm but not exclusively. A voltage applied across a thin film of such a material will ensure that there is a uniform electric field along any straight hole through the resistive material. The hole is made normal to the parallel sides of the thin wafer or film, which is the body of the accelerator and can be loosely termed a nanocolumn, in line with the previous terminology for a column constructed from a multilayer of alternate insulating and conducting thin films. (Nanocolumn is used because the aperture through the film is in the nanometre size range.) In this circumstance the electric field is along the (evacuated) hole and it can thus accelerates electrons injected into the hole. A nanotip, which can be positioned above a hole of typical aperture 50 nm and at a distance of around 30 nm, will field emit electrons if the voltage on the tip exceeds that of the surface by about 10 volts. Both surfaces of the semiconductor are covered with a thin metallic film through which holes are manufactured concentric with the hole in the semiconductor. The diameter of the holes in the metallic film are smaller than that in the semiconductor so that these apertures act as anti-scatter collimators and can also be used to reduce the electron beam emittance.

The operation of these nanocolumns in focussed electron and beam devices is as follows. A negative voltage is applied to the metallic layer nearest to the nanoprobe and larger negative voltage is applied to the nanotip. The metallic layer on the other semiconductor surface is at earth potential. By choosing these voltages correctly electrons emitted from the tip can be focussed and accelerated down the hole in the nanocolumn. An almost parallel beam of electrons with diameters less than 50 nm can be produced.

For the best performance, the diameter of a collimator aperture needs to be less than 100 nm and the thickness of the silicon larger than 0.5 µm. If this arrangement is to be effective, it is essential that the device contains collimators to both reduce the scattering from the walls (of the nanoscale hole) and to reduce the total emittance of the beam. The latter can be extremely important since the total emittance of the beam is proportional to the final beam spot size. Thus a large decrease in emittance brought about by using carefully chosen collimators can lead to a significant reduction in the final beam spot size. Two methods are available for producing collimators at the nanoscale. In the first method the nanoscale column has a conical hole in it with the smaller diameter hole closest to the nanotip electron source. In this way scattering of the electron beam from the inside walls of the hole can be largely eliminated. A conical shape can be replaced by a form in which the aperture of the hole is reduced more abruptly at the position where collimation is required. These collimators can be formed at both ends of the tube if needed. In another scheme, a thin metal covering layer at either or both end(s) of the hole is ion etched to produce a collimator. This can be done by dry etching techniques or using a focussed ion beam (FIB) milling machine.

Figure 9A:
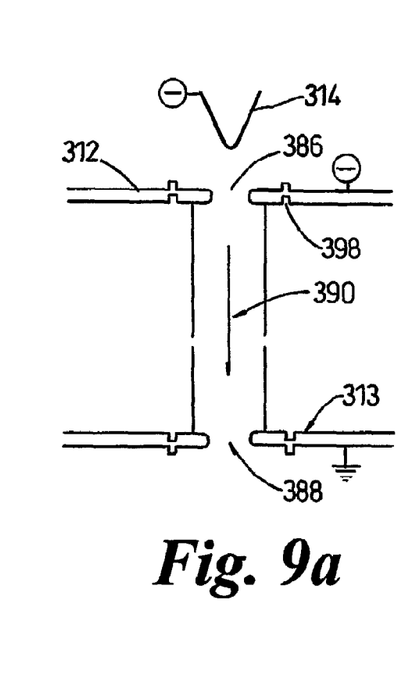
Figure 9B:
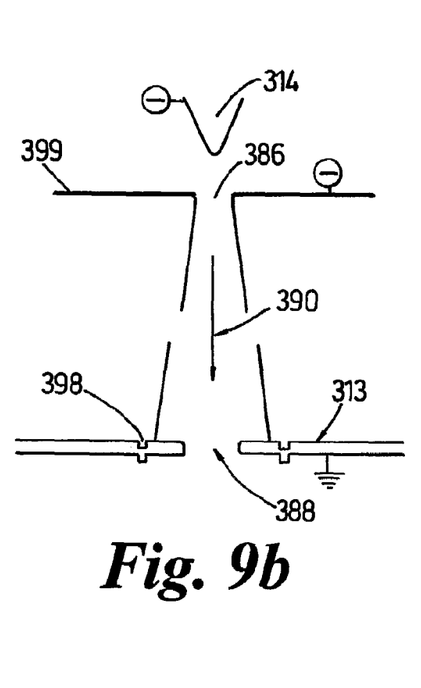
Figure 9C:
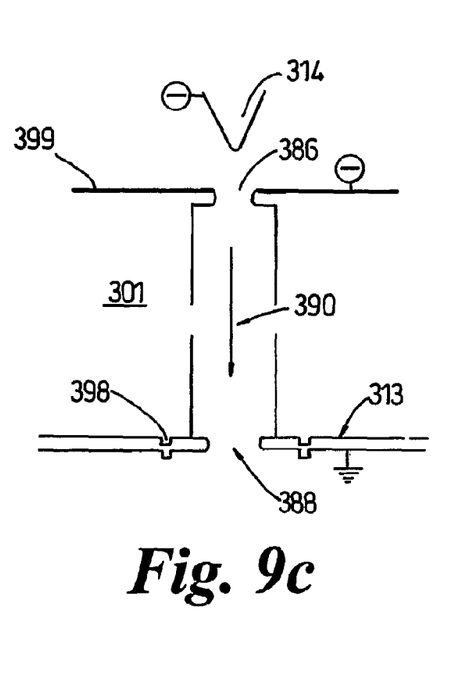

General arrangements are shown in FIG. 9, with the electron source being a nanotip 314 at the entrance to the first nanoscale section of the device with the beam direction 390 being marked. FIG. 9a shows a section of material 301 of micron thickness through which is fabricated a 50 nm (typical size) circular hole by dry etching techniques. The walls of this hole can be made parallel if the etching is carefully controlled. The whole microscope column or assembly can be made with accelerating sections and non-accelerating sections as described in a previous embodiment. One method of fabricating these apertures 386 and 388 is as follows. During the production of the hole, registration features 398 are produced on the surface to delineate the aperture position. The surface is then coated with a nanometer thick gold layer by vacuum deposition techniques (atomic deposition from a source) and a 2–3 nm (typical) thick gold foil, 312 and 313 is placed over the aperture on top of this first layer. (If this is done in clean conditions the gold foil will bond to the vacuum deposited gold layer on the silicon.) It is then possible to produce apertures, 386 and 288 in this metal foil by ion beam drilling or dry etching. (For this to be possible it is important that the registration remains visible after the gold layer is applied.) FIG. 9b shows an alternative way of producing an aperture particularly at the entrance to the accelerating section. In this method the hole is tapered into a conical shape as shown. This tapering can be produced by carefully controlling the dry etching process. The top conducting layer 399 is then made by depositing a metal on the surface using standard vacuum deposition methods. A further aperture made by the previous method can be placed below this assembly as shown in the central diagram. However it is also possible to produce a collimator at this position by placing a second wafer with a tapered hole in it below the one shown in the central diagram. This then replaces the aperture made from thin film metal (gold). It can be made in a separate thin wafer (of silicon) which is positioned so that the holes are concentric or the whole assembly can be fabricated in one piece. Thus the system now consists effectively of two wafers with conical holes with both wafers vacuum coated on their flat sides with metallic films. It is also possible to produce a collimator from the intrinsic material of the wafer not necessarily in the form of a taper as is shown in FIG. 9c. Collimators can be manufactured at either or both ends of the assembly or assemblies (wafers). These can be stacked to minimise scattering and/or reduce the phase space emittance of the beam.

The invention claimed is:

1. A particle beam generator, comprising an extracting plate, having an extracting aperture, disposed adjacent a particle source and operable to extract particles from such a source into the extracting aperture to form a particle beam, particle accelerating means operable to accelerate the extracted particles to increase the energy of the beam, and collimating means operable to collimate the particle beam, characterized in that said extracting plate is disposed sufficiently close to said particle source such that this proximity, in combination with the provision of an electric field applied to either side of said extracting aperture to provide a focusing effect on the particle beam passing through the extracting aperture, together inhibit lateral expansion of said particle beam such that it has a diameter of less than 100 nm.

2. A particle beam generator, as claimed in claim 1, further comprising focussing means operable to provide, from the laterally inhibited particle beam, a focussed particle beam having a diameter less than 1 nm.

3. A particle beam generator as claimed in claim 1, wherein the diameter of the extracting aperture is substantially between 5 nm and 500 nm.

4. A particle beam generator as claimed in claim 3, wherein the diameter of the extracting aperture is substantially between 5 nm and 100 nm.

5. A particle beam generator as claimed in claim 1, wherein the particle accelerating means comprises a plurality of accelerator plates arranged in a stack and electrically isolated from each other, each accelerator plate having an aperture arranged to share a common longitudinal axis with the extracting aperture to form an extended accelerating aperture along which the extracted particles are accelerated on application of a voltage between the extractor plate and a first accelerator plate and between each pair of successive adjacent accelerator plates arranged in the column thereafter.

6. A particle beam generator as claimed in claim 1, wherein the extracting plate is a first conductor which is separated from a second conductor by at least one of a resistive and insulator material, and the accelerating means comprises an accelerating aperture which extends from the extractor aperture through the at least one of the resistive and insulator material and through the second conductor, wherein the extracted particles are accelerated on application of a differential voltage between the first and second conductors.

7. A particle beam generator as claimed in claim 6, wherein the resistance of the at least one of the resistive and insulator materials is substantially between 1 kΩm-cm and infinity.

8. A particle beam generator as claimed in claim 5, wherein the diameter the accelerating aperture is substantially between 10 nm and 100 µm.

9. A particle beam generator as claimed in claim 1, wherein the collimating means is integrally formed with the accelerating means.

10. A particle beam generator as claimed in claim 9, wherein the accelerating means includes an accelerating aperture through which the particle beam passes to thereby create an accelerated beam, and wherein the collimating means comprises a conical configuration of said accelerating aperture, the conical accelerating aperture having a diameter increases in the direction of the accelerated beam.

11. A particle beam generator as claimed in claim 10, wherein the collimating means comprises at least one aperture having a lesser diameter relative to the accelerating aperture and is disposed on the longitudinal axis thereof.

12. A particle beam generator as claimed in claim 1, comprising a particle source integrated therewith.

13. A particle beam generator as claimed in claim 12, wherein the particle source is a field emission source.

14. A particle beam generator as claimed in claim 1 adapted for use with an electron particle source.

15. A particle beam generator as claimed in claim 1 adapted for use with an ion particle source.

16. A near field microscope comprising a particle beam generator as claimed in claim 1.

17. A microchip comprising a particle beam generator as claimed in claim 1.

* * * * *